(12) United States Patent
Yasumatsu

(10) Patent No.: US 11,768,477 B2
(45) Date of Patent: Sep. 26, 2023

(54) MACHINING CONTROL DEVICE AND METHOD FOR MACHINE TOOL

(71) Applicant: FANUC CORPORATION, Yamanashi (JP)

(72) Inventor: Yuuki Yasumatsu, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 407 days.

(21) Appl. No.: 17/003,992

(22) Filed: Aug. 27, 2020

(65) Prior Publication Data

US 2021/0080920 A1 Mar. 18, 2021

(30) Foreign Application Priority Data

Sep. 18, 2019 (JP) .................. 2019-169197

(51) Int. Cl.
*G05B 19/31* (2006.01)
*G05B 19/402* (2006.01)
*G06F 30/20* (2020.01)

(52) U.S. Cl.
CPC .......... *G05B 19/31* (2013.01); *G05B 19/402* (2013.01); *G06F 30/20* (2020.01); *G05B 2219/33301* (2013.01)

(58) Field of Classification Search
CPC .................. G05B 19/31; G05B 19/402; G05B 2219/33301; G05B 19/4155; G05B 19/408; G06F 30/20
See application file for complete search history.

(56) References Cited

U.S. PATENT DOCUMENTS

2016/0033956 A1 2/2016 Miyazaki et al.

FOREIGN PATENT DOCUMENTS

| JP | H7239707 A | 9/1995 |
| JP | 201631725 A | 3/2016 |
| JP | 2016-103166 A | 6/2016 |

*Primary Examiner* — Tejal Gami
(74) *Attorney, Agent, or Firm* — HAUPTMAN HAM, LLP

(57) ABSTRACT

A machining control device for a machine tool reads a machining program for each predetermined reading unit, controls a machining operation of a machine tool based on the read machining program, performs a machining simulation by sequentially reading out the read machining program, and discriminates a buffer state based on the result of the machining simulation. If insufficient buffering is discriminated in the control of the machining operation, control is performed to stop machining on a non-machining path short of the position of occurrence of the insufficient buffering.

11 Claims, 10 Drawing Sheets

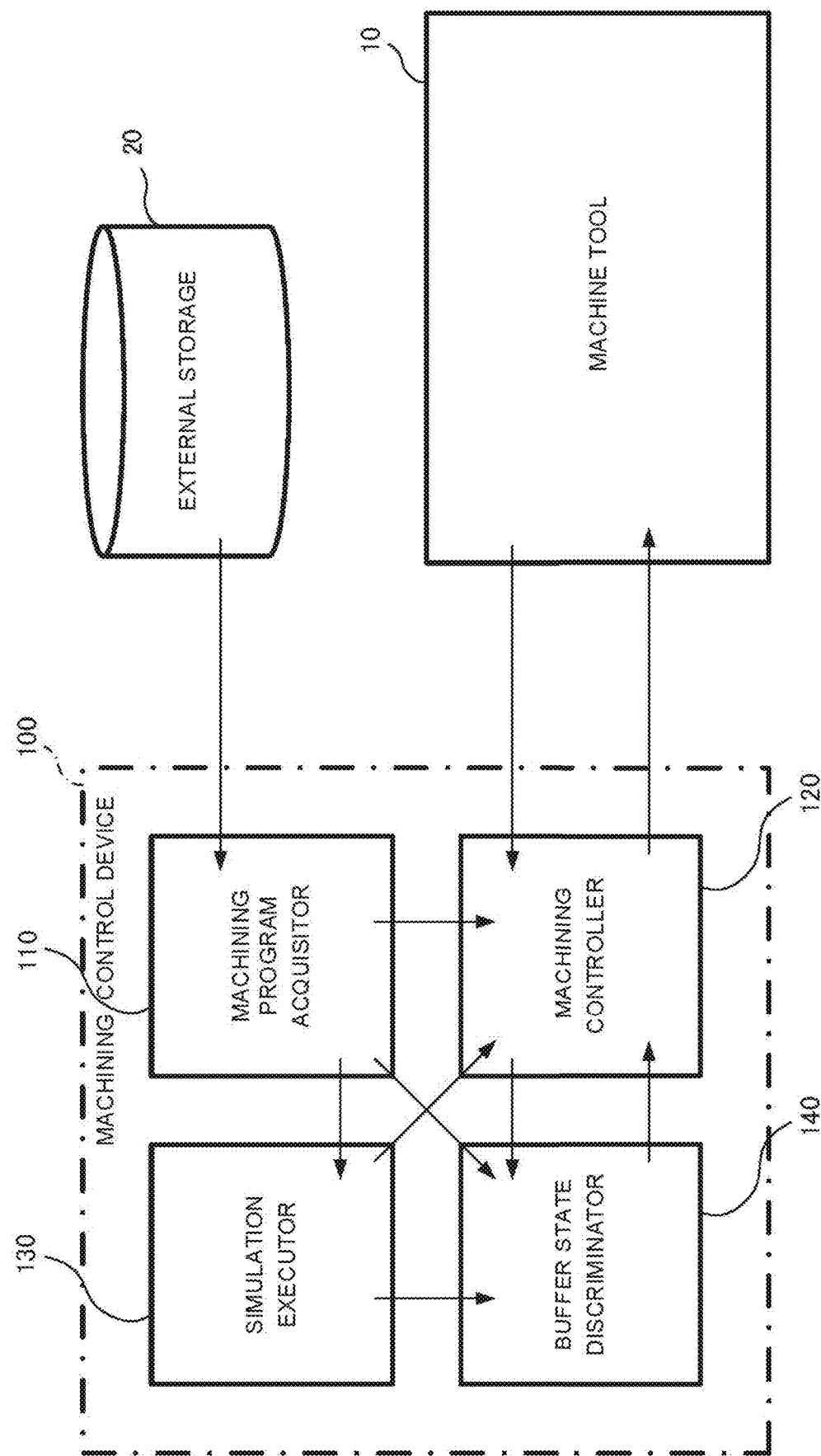

| EXECUTION TIMES FOR BLOCKS (s) | | | |
|---|---|---|---|
| N1 | 1.0 | N5 | 0.8 |
| N2 | 0.1 | N6 | 0.1 |
| N3 | 0.8 | N7 | 1.0 |
| N4 | 0.2 | N8 | 0.3 |

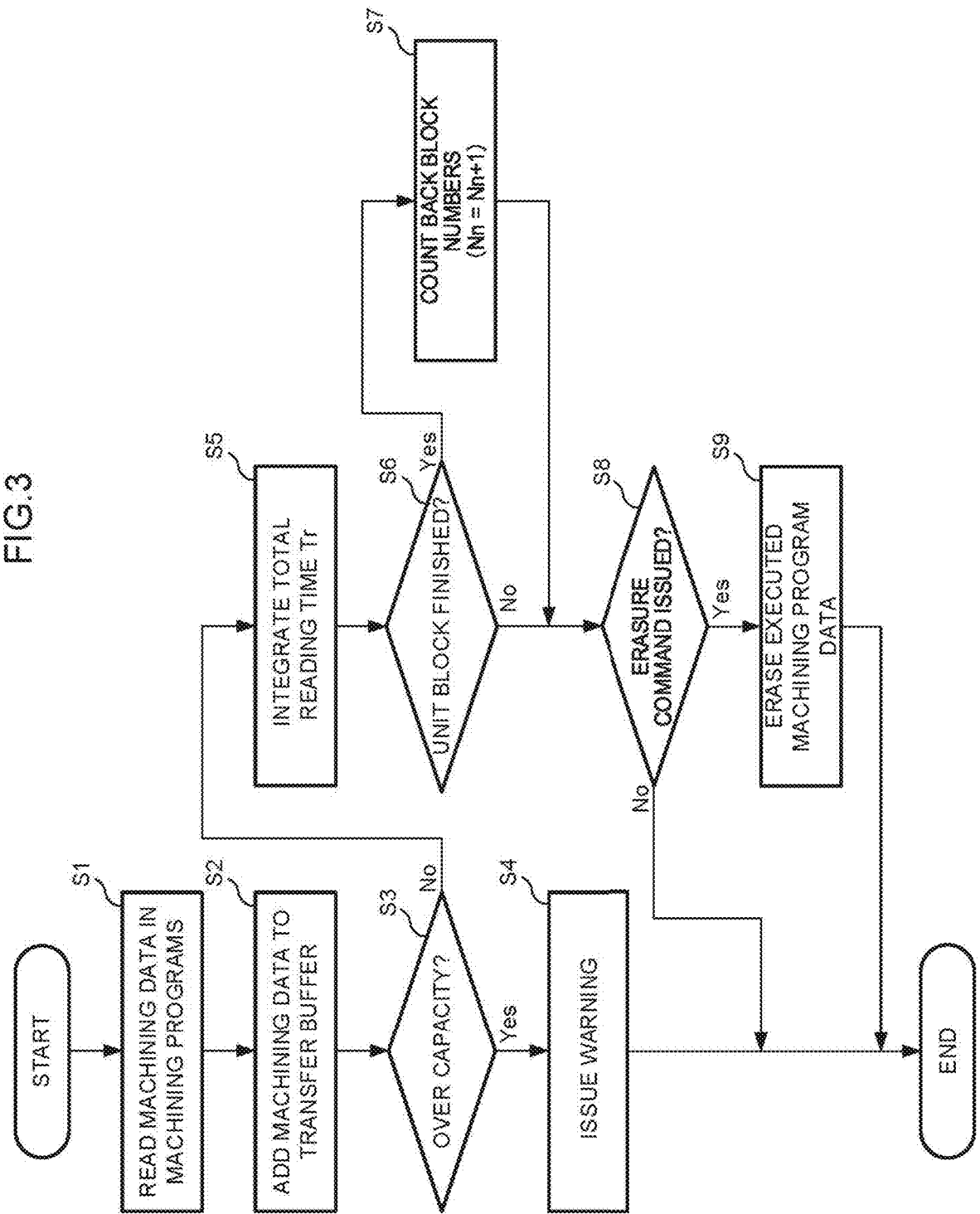

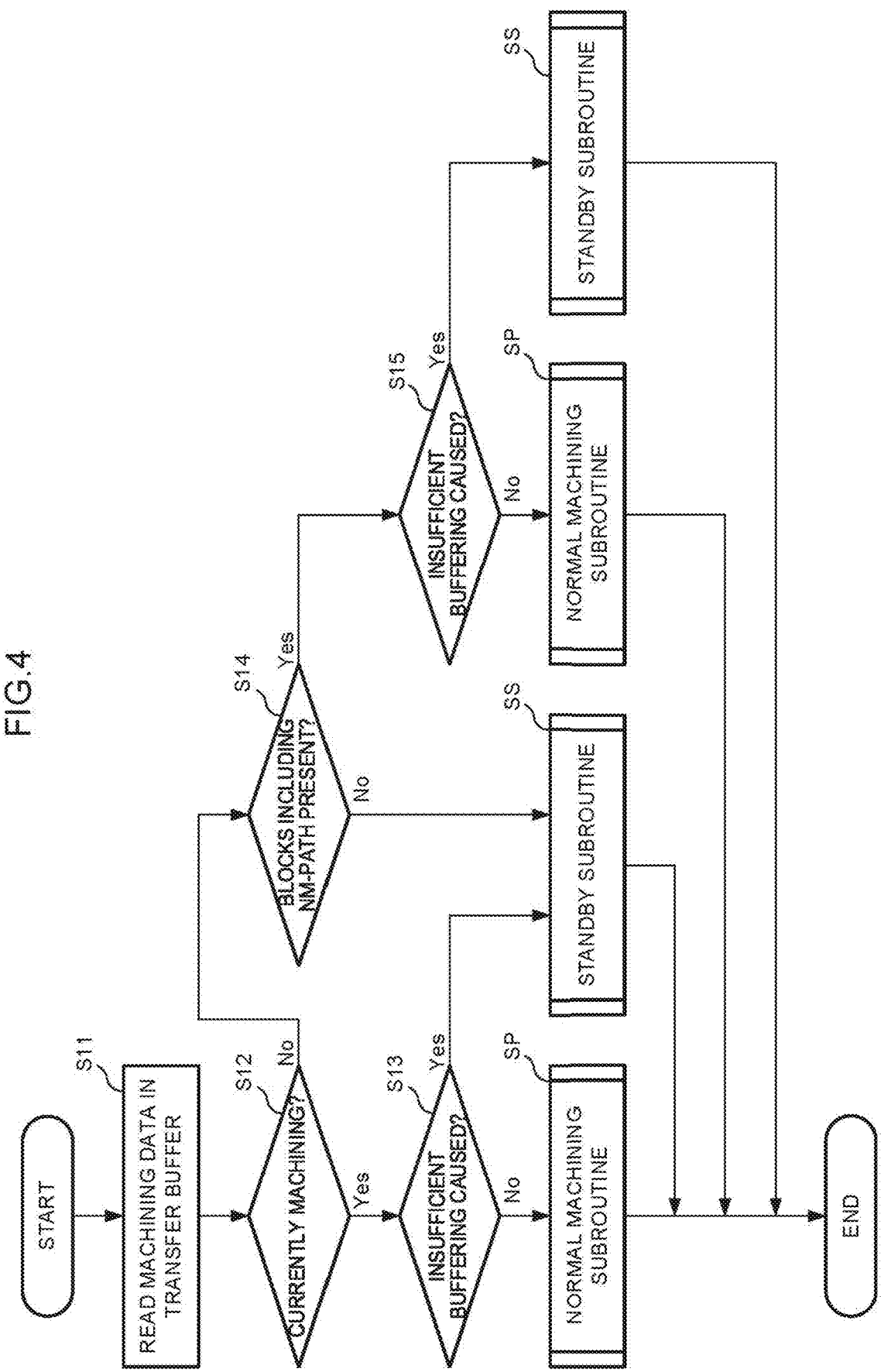

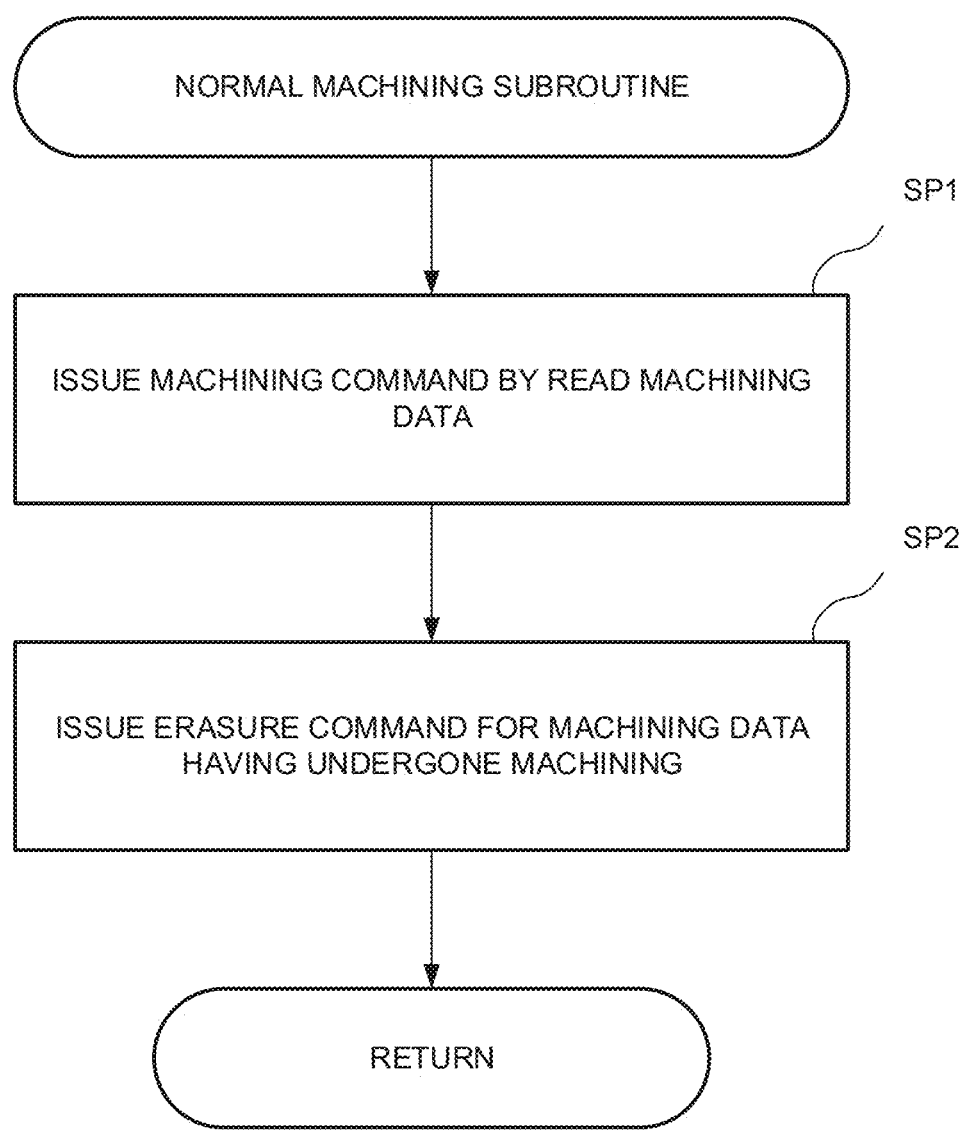

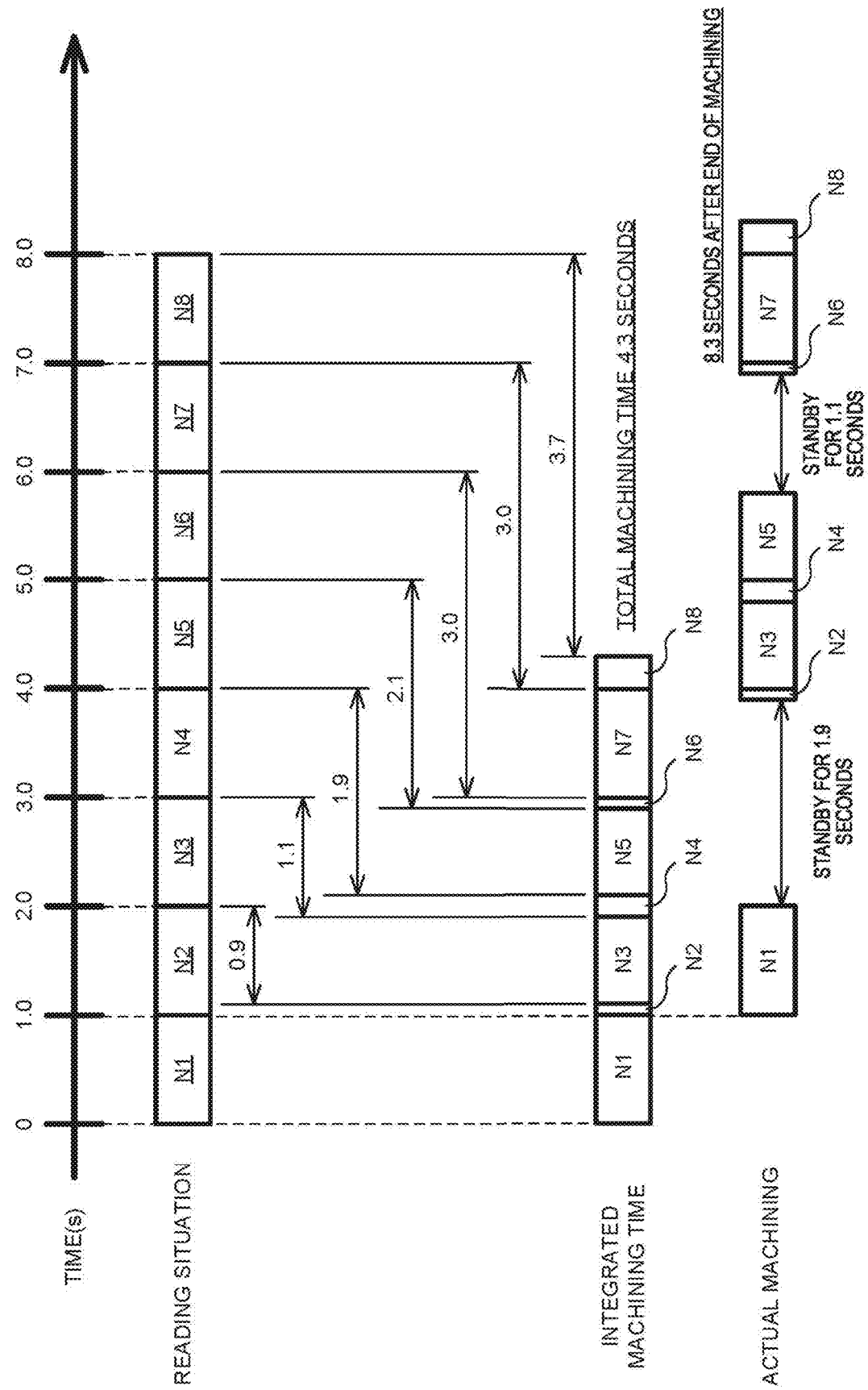

| EXECUTION TIMES FOR BLOCKS (s) | | | |
|---|---|---|---|
| N1 | 1.0 | N5 | 0.6 |
| N2 | 0.1 | N6 | 0.2 |
| N3 | 0.8 | N7 | 0.8 |
| N4 | 0.2 | N8 | 0.3 |

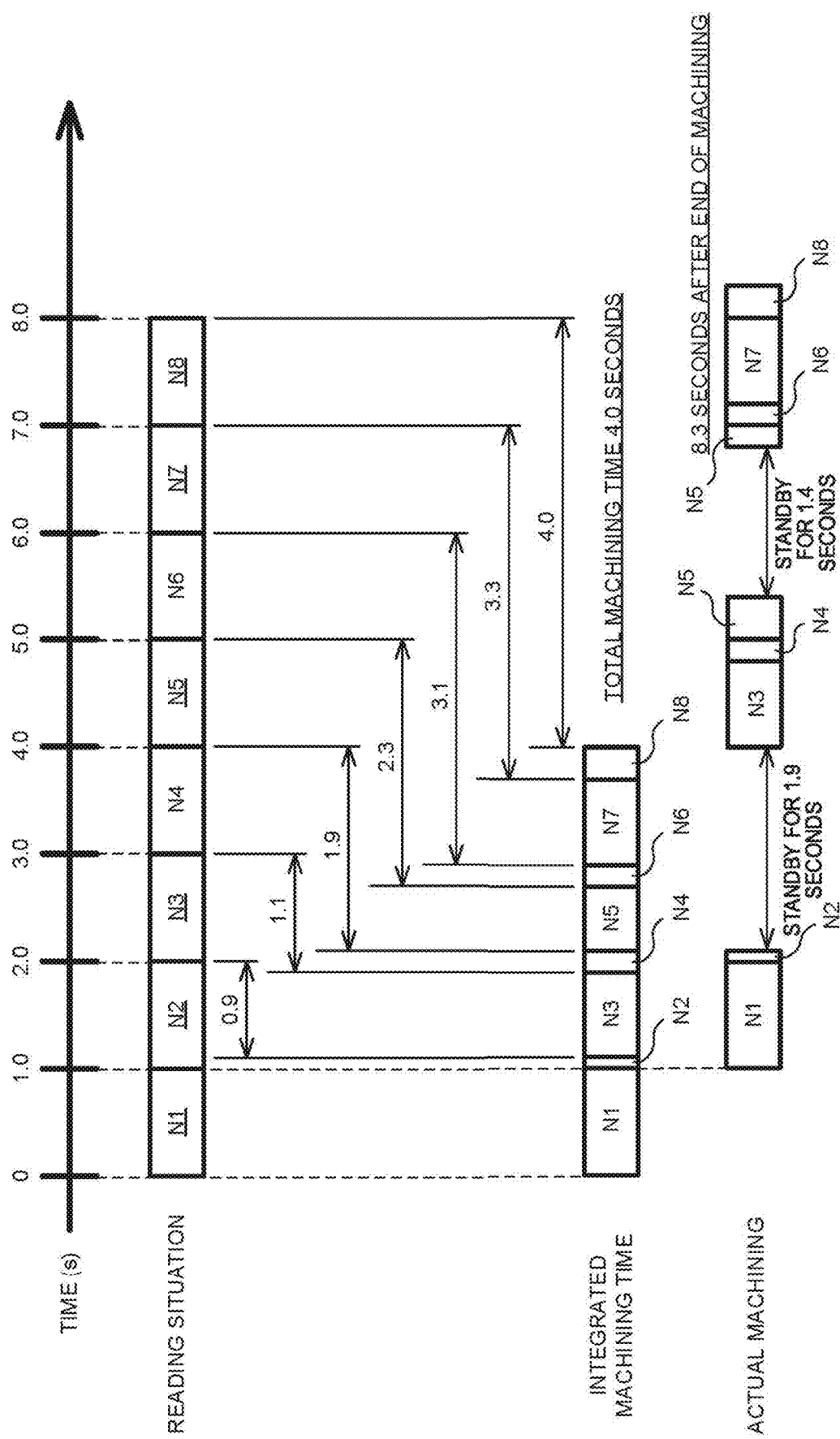

MACHINING CONTROL DEVICE AND METHOD FOR MACHINE TOOL

RELATED APPLICATION

The present application claims priority to Japanese Patent Application Number 2019-169197 filed on Sep. 18, 2019, the disclosure of which is hereby incorporated by reference herein in its entirety.

BACKGROUND OF THE INVENTION

Field of the Invention

The present invention relates to a machining control device and a machining control method for a machine tool.

Description of the Related Art

A machining control device for controlling a machine tool performs machining based on machining programs. The volume of the machining programs tends to become larger with the improvement of the precision of workpieces. In not a few cases, the volume of machining programs for mold machining and the like exceeds the capacity of an internal storage device (dynamic random access memory (DRAM) or the like) of a computerized numerical control (CNC). In a known technology as a manner to deal with this problem, the machining control device sequentially acquires some of machining programs from external storage devices (such as compactfrash card, SD memory card and universal serial bus (USB) device) and external computers (such as server) that are connected thereto for communication to accumulate (or buffer) the acquired machining programs into an internal storage device. According to this manner, the machining control device can implement a continuous program operation.

The speed of transfer, if any, of the machining programs from the external storage devices or external computers to the machining control device is not constant. In the machining control device, therefore, a state of transfer waiting (so-called "buffer waiting") is generated such that accumulated data are executed earlier than the transfer of the machining programs in the middle of machining control by the machining control device using the machining programs sequentially acquired from the external storage devices. If this transfer waiting state is generated, the control is temporarily interrupted during machining, inevitably resulting in degradation of the quality of the machining.

In order to overcome this phenomenon, Japanese Patent Application Laid-Open No. H7-239707 discloses a numerical controller with a remote operation function such that as machining program data transferred from a machining program storage device through communication means are stored into an operation buffer in a memory, the machining program data in the operation buffer are sequentially taken out in units of blocks for the execution of an operation. This numerical controller includes setting means and tool retraction control means. The setting means sets a retraction escape amount and the number of operation resumption blocks as tool retraction conditions for resuming the operation after a tool in cutting work is retracted in the axial direction of tool mounting when the machining program data in the operation buffer are exhausted. The tool retraction control means causes the tool in cutting work to retract for the retraction escape amount after the end of a block immediately before the number of remaining blocks for the machining program data in the operation buffer becomes 0, and restores the tool for the retraction escape amount from its retracted position and resumes the machining if the number of blocks for operation resumption is exceeded by the number of remaining blocks for the machining program data in the operation buffer as the machining program data are transferred from the machining program storage device. In this way, the state (enabled/disabled) of cutting tool retraction with the operation buffer empty can be set for the machining program data in the operation buffer, so that the machining time for machining spots in which the cutting tool retraction is unnecessary is believed to be reducible.

Moreover, Japanese Patent Application Laid-Open No. 2016-31725 discloses a numerical controller in which machining programs are buffered from external storage devices or external control devices into an internal memory through connection means and in which an automatic operation executor performs an automatic operation based on the buffered machining programs. The machining programs include one or a plurality of buffering points. The automatic operation executor includes buffering completion confirmation result retaining means, execution confirmation result retaining means, comparison means, and execution means. The buffering completion confirmation result retaining means confirms whether or not the buffering point or points are included in the machining programs to be buffered, in the machining program buffering into the internal memory, and retains the result of the confirmation. The execution confirmation result retaining means confirms whether or not the buffering point or points are included in the machining programs to be executed, when the automatic operation executor executes the machining programs buffered in the internal memory, and retains the result. The comparison means compares the buffering completion confirmation result retaining means with the execution confirmation result retaining means. The execution means continues, suspends or resumes the automatic operation based on the result of the comparison. With use of the numerical controller of this type, it is believed that the machining cannot be stopped in any other spots than previously designated buffering points even in case the internal memory inevitably becomes empty due to slow data transfer. Furthermore, the numerical controller of this type is assumed to be free from the problem of generation of so-called "cutter marks" on workpieces or occurrence of vibration.

Normally, if a machine tool adapted for automatic operation is subjected to some trouble while it is being controlled, the control will be interrupted to cause an emergency stop of the workpiece machining in many cases. If this emergency stop is caused when a workpiece and a tool are in contact with each other, a cutter mark will be made on the workpiece, so that the yield of production of this workpiece as a product will inevitably be reduced.

In order to suppress this reduction of the yield of production at the time of the emergency stop, according to the disclosure of the patent literatures described above, for example, the numerical controllers perform processing for retracting the tool from the workpiece in suspending the automatic control of machining, and a point of machining is restored to continue the machining after trouble is eliminated. However, if the numerical controllers perform an operation to temporarily retract the tool during the machining, it is difficult to reproduce (or restore) the state of machining having been being continuously performed on a machining path, although the position of machining itself can be restored. Consequently, according to these numerical controllers, the machining precision of those workpieces which are subjected to the suspension of machining is inevitably reduced.

Also, Japanese Patent Application Laid-Open No. 2016-31725 teaches how non-cutting orders that never cause generation of cutter marks despite the suspension of the automatic operation can be set on buffering points. However, in order to perform the operation for the machining suspension, the execution means requires the buffering points to be included in the blocks of the read machining programs. In order to improve the machining precision, therefore, it is necessary to make the buffering points be previously included in all the blocks of the machining programs. In this case, there is a problem that creation of the machining programs causes a heavier load and the versatility of the machining programs is reduced.

SUMMARY OF THE INVENTION

Accordingly, it is required for a machining control device and method for a machine tool capable of overcoming a state of insufficient buffering without providing any special additional points in machining programs and without reducing the yield of production after machining, in automatic machining control of the machine tool.

A machining control device for a machine tool according to the present invention is configured to perform machining control for a workpiece using a machining program including a machining path and a non-machining path and includes a machining program acquisitor configured to read the machining program for each predetermined reading unit, a machining controller configured to control a machining operation of the machine tool based on the machining program read by the machining program acquisitor, a simulation executor configured to perform a machining simulation by sequentially reading out the machining program read by the machining program acquisitor, and a buffer state discriminator configured to discriminate a buffer state of the machining program acquisitor, based on the result of the machining simulation. The machining controller performs control to stop machining on the non-machining path short of the position of occurrence of insufficient buffering if the insufficient buffering is discriminated by the buffer state discriminator.

A machining control method for a machine tool according to the present invention is configured to perform machining control for a workpiece using a machining program including a machining path and a non-machining path and includes reading the machining program for each predetermined reading unit and controlling a machining operation of the machine tool based on the read machining program. In the control of the machining operation, the method further includes performing a machining simulation by sequentially reading out the read machining program and discriminating a buffer state of the machining program based on the result of the machining simulation, and stopping machining on the non-machining path short of the position of occurrence of insufficient buffering if the insufficient buffering is discriminated.

According to the present invention, a specific advantage can be obtained such that the state of insufficient buffering can be overcome without providing any special additional points in machining programs and without reducing the yield of production after machining, in automatic machining control of the machine tool. This can be done because the machining control device or method for a machine tool according to the present invention is configured to discriminate the buffer state of the machining programs, based on the sequentially read result of the machining simulation, and the machining is stopped on the non-machining path short of the position of occurrence of the insufficient buffering in accordance with the result of this discrimination.

BRIEF DESCRIPTION OF THE DRAWINGS

The above and other objects and features of the present invention will be apparent from the ensuing description of embodiments with reference to the accompanying drawings, in which:

FIG. 1 is a block diagram showing the relationship between a representative and exemplary machining control device of the present invention and its peripheral devices;

FIG. 3 is a flowchart showing an outline of an operation for reading a machining program according to the first embodiment;

FIG. 4 is a flowchart showing an outline of a machining control operation performed in parallel with the machining program reading operation shown in FIG. 3, in the first embodiment;

FIG. 5 is a flowchart showing an outline of an operation of a normal machining subroutine shown in FIG. 4;

FIG. 7 is a timing chart showing an example of a machining control method for a machine tool according to the first embodiment;

FIG. 10 is a timing chart showing an example of a machining control method for a machine tool according to the second embodiment.

DETAILED DESCRIPTION OF THE PREFERRED EMBODIMENTS

Figures 2A, 2B:
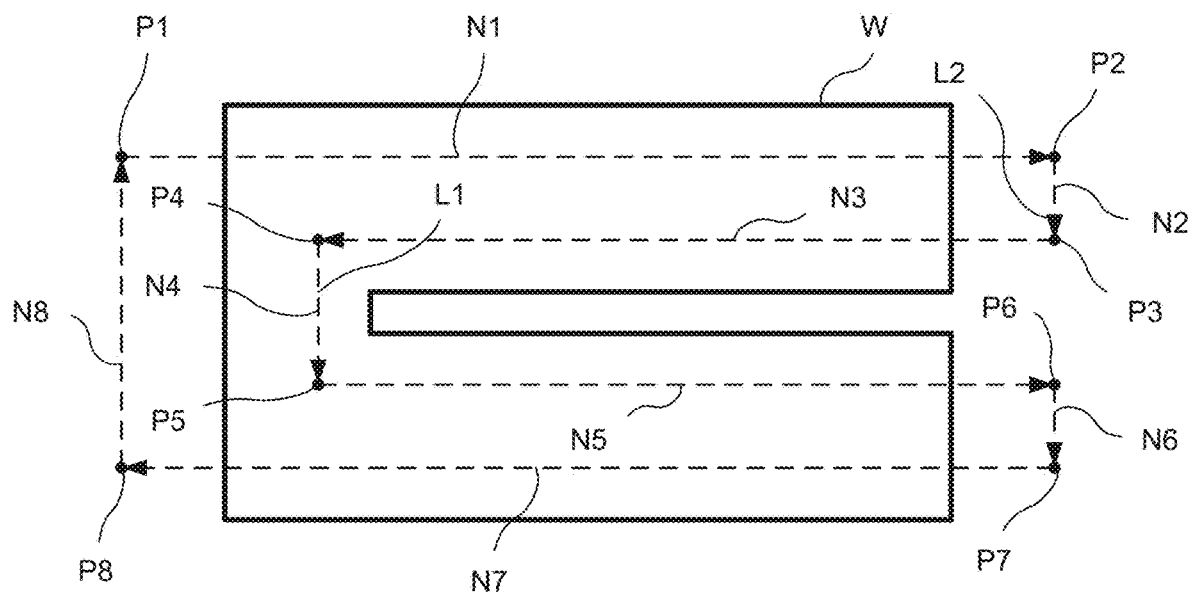
FIGS. 2A and 2B are plan views showing the relationship between a workpiece and a machining path according to a first embodiment of the machining control device and its peripheral devices shown in FIG. 1.

Some embodiments of a representative exemplary machining control device and method for a machine tool of the present invention will now be described with reference to the accompanying drawings.

FIG. 1 is a block diagram showing the relationship between the representative exemplary machining control device of the present invention and its peripheral devices. As shown in FIG. 1, a machining control device 100 for a machine tool includes a machining program acquisitor 110 and a machining controller 120. The machining program acquisitor 110 reads machining programs including a machining path and a non-machining path for each predetermined reading unit. The machining controller 120 controls the machining operation of a target device to be controlled, e.g., a machine tool 10, based on the machining programs read by the machining program acquisitor 110. The machining control device 100 further includes a simulation executor 130 and a buffer state discriminator 140. The simulation executor 130 performs a machining simulation by sequentially reading out the machining programs read by the machining program acquisitor 110. The buffer state discriminator 140 discriminates a buffer state of the machining program acquisitor 110, based on the result of the machining simulation.

The machining control device 100 is connected with the machine tool 10 and an external storage 20 for mutual communication through a wired or a wireless communication line. Based on this connection configuration, the machining control device 100 issues various commands for machining to the machine tool 10 and then receives detection signals from various sensors attached to the machine tool 10. Moreover, the machining control device 100 retrieves various data, machining programs and the like to be used for the machining by the machine tool 10 from the external storage 20. If necessary, the machining control device 100 further updates those data and machining programs.

The machining program acquisitor 110 sequentially receives the machining programs from the external storage 20 to go on temporarily accumulating the received machining programs into a transfer buffer (not shown) in the acquisitor 110. This accumulation operation is called buffering. Furthermore, the machining program acquisitor 110 erases those machining programs used for programmed operation from the transfer buffer in response to an erasure command transmitted from the machining controller 120.

The machining controller 120 controls the machine tool 10 by sequentially reading out the accumulated machining programs from the transfer buffer and issuing a machining command, based on the result of discrimination by buffer state discriminator 140 (described later). Such a series of operations is called the programmed operation. Moreover, the machining controller 120 transfers data based on the sensor detection signals obtained from the machine tool 10 to the buffer state discriminator 140. Thus, the machining controller 120 can be configured as a control device, control unit or similar control means for controlling the machine tool 10.

The provision of the simulation executor 130 and the buffer state discriminator 140 can be given as an important structural significance in the machining control device 100 for a machine tool according to the present invention. The simulation executor 130 can read out the machining programs stored in the machining program acquisitor 110 to perform a machining simulation for buffering and programmed operation by a prior art manner. The simulation executor 130 may be configured either to sequentially perform this machining simulation in parallel with a machining program reading operation or, for example, to execute it every time a machining block of a machining program is read. The result of the machining simulation performed by the simulation executor 130 is transferred to both the machining controller 120 and the buffer state discriminator 140.

The buffer state discriminator 140 compares the capacity of machining programs having been consumed by the programmed operation at a certain point in time and that of machining programs accumulated by the buffering, based on the result of the machining simulation by the simulation executor 130. Based on the result of this comparison, the buffer state discriminator 140 can discriminate whether or not a state (referred to as insufficient buffering) in which the capacity of the accumulated machining programs is insufficient will occur. The buffer state discrimination includes an operation for identifying the position of occurrence of insufficient buffering, in addition to the discrimination of whether or not the insufficient buffering is caused. The position of occurrence of insufficient buffering indicates, for example, a position on the machining or non-machining path.

First Embodiment

FIG. 2A is a plan view showing the relationship between a workpiece and a machining path according to a first embodiment of the representative exemplary machining control method for a machine tool of the present invention. In the first embodiment, as shown in FIG. 2A, a workpiece W with a substantially C-shaped cross section is subjected to machining control by a machining program composed of machining blocks N1 to N8 that connect indication points P1 to P8. Each of the machining blocks N1 to N8 may include a machining path L1 along which the workpiece W is machined by a tool (not shown) and a non-machining path L2 along which the tool moves at a distance from the workpiece W. Moreover, FIG. 2B shows execution times (seconds) for the individual machining blocks N1 to N8 during the machining of the workpiece W shown in FIG. 2A.

FIG. 3 is a flowchart showing an outline of an operation for reading a machining program according to the first embodiment. The machining program reading operation shown in FIG. 3 is assumed to be performed by the machining program acquisitor 110 for each predetermined clock frequency in response to a command from the machining controller 120 shown in FIG. 1.

In the machining program reading operation, some of machining programs are first read from the external storage 20 into the transfer buffer in the machining control device 100 in units of the above-mentioned clock frequency (Step S). Also, some of the read machining programs are accumulated in the transfer buffer in the machining program acquisitor 110 (Step S2). If there are any data already accumulated in the transfer buffer at this time, some of machining programs newly read in Step S1 are added and accumulated into the transfer buffer.

Subsequently, the buffer state discriminator 140 discriminates whether or not the capacity of the transfer buffer in the machining program acquisitor 110 is exceeded by adding the data in Step S2 (Step S3). If it is then discriminated that the capacity of the transfer buffer is exceeded, the machining control device 100 determines that the machining program data for the execution of subsequent machining is insufficient (e.g., a phenomenon is generated such that a physical memory constituting the transfer buffer is abnormal). Moreover, the machining control device 100 issues a warning to the effect that "insufficient buffering" is caused (Step S4), whereupon the reading operation by the machining program acquisitor 110 ends.

In contrast, if it is discriminated in Step S3 that the capacity of the transfer buffer is not exceeded, it is discriminated that the machining program data is normally accumulated in the transfer buffer. The machining program acquisitor 110 integrates a total reading time Tr since the start of the reading under the control of the machining controller 120 (Step S5). Then, under the control of the machining controller 120, the machining program acquisitor 110 discriminates whether or not an end position of a fixed unit block 3 is reached by the machining program data having been read so far, that is to say, whether or not the fixed unit block has finished being read as the machining program data (Step S6).

If it is discriminated in Step S6 that the unit block has not finished being read, that is, the read machining program data is in the middle of the fixed unit block, the machining program acquisitor 110, under the control of the machining controller 120, discriminates whether or not such a command is issued from a machining command operation (described later) as to erase the machining program data accumulated in the transfer buffer (Step S8). In contrast, if it is discriminated in Step S6 that the unit block has finished being read, the machining program acquisitor 110 counts up block numbers Nn indicative of the numbers of those unit blocks finished in association with the above-described total reading time Tr (Step S7). When a first block has finished being read, for example, its data are grouped as a block N1.

Subsequently, if it is discriminated in Step S8 that the erasure command for the machining program data is received, the machining program acquisitor 110 discriminates that machining for some unit blocks of the machining program already read in a machining command operation (described later) is finished and erases data of executed machining programs from the transfer buffer (Step S9), whereupon the reading operation ends. In contrast, if it is discriminated in Step S8 that the erasure command is not received, the machining program acquisitor 110 finishes the reading operation in such a state that data of the machining programs having been read so far are accumulated in the transfer buffer.

By executing the operation flow described above, data of the machining programs associated with the total reading time Tr are accumulated in the transfer buffer of the machining program acquisitor 110 of the representative exemplary machining control device of the present invention, for each predetermined clock frequency described above. As this is done, the data are grouped and named for each fixed machining block.

FIG. 4 is a flowchart showing an outline of a machining control operation performed in parallel with the machining program reading operation shown in FIG. 3. The machining command operation shown in FIG. 4, as with the machining program reading operation shown in FIG. 3, is assumed to be performed by the machining program acquisitor 110 in synchronism with the above-mentioned reading operation for each predetermined clock frequency in response to a command from the machining controller 120.

In the machining command operation, some of machining programs having been accumulated so far are first read from the transfer buffer in the machining program acquisitor 110 into the buffer state discriminator 140 (Step S11). Then, it is discriminated by the machining controller 120 whether or not the machine tool is currently performing the machining operation (Step S12).

If it is discriminated in Step S12 that the machining operation is currently being performed, the buffer state discriminator 140 discriminates whether or not insufficient buffering is caused in the transfer buffer (Step S13). As mentioned before, this operation for discriminating the insufficient buffering is performed by comparing the capacity of machining programs having been consumed by the programmed operation at a certain point in time and that of machining programs accumulated by the buffering, based on the result of the machining simulation by the simulation executor 130. Also, the buffer state discriminator 140 can identify the position of occurrence of insufficient buffering (position on the machining or non-machining path), based on the total reading time Tr and the result of the machining simulation.

If it is discriminated in Step S13 that insufficient buffering is not caused, it is assumed that some of the machining programs are normally accumulated in the transfer buffer. And then, the machining controller 120 executes a normal machining subroutine SP to finish the machining command operation. In contrast, if it is discriminated in Step S13 that the insufficient buffering is caused (or there is a possibility of insufficient buffering occurring during the machining), the machining controller 120 executes a standby subroutine SS to avoid unexpected stoppage of the machining on the machining path L1 to finish the machining command operation.

Moreover, if it is discriminated in Step S12 that the machining operation is not currently being performed, the buffer state discriminator 140 discriminates whether or not there are any machining blocks including the non-machining path (NM-path) L2 in some of the machining programs read in Step S11 (Step S14). This discrimination operation can be performed based on the result of the machining simulation performed by the simulation executor 130 for some of the machining programs accumulated in the transfer buffer. Moreover, if the machining programs include data for previously distinguishing the machining path L1 from the non-machining path L2 or similar data, the buffer state discriminator 140 may discriminate the presence or absence of the machining programs based on whether or not the data are included.

If it is discriminated in Step S14 that there are no machining blocks including the non-machining path L2 in some of the read machining programs, the machining controller 120 executes the standby subroutine SS to discriminate whether to maintain the current machining stop state or to start the machining and then finishes the machining command operation. In contrast, if it is discriminated in Step S14 that there are machining blocks including the non-machining path L2, the buffer state discriminator 140 discriminates whether or not insufficient buffering is caused in the transfer buffer (Step S15). This operation for discriminating the insufficient buffering is similar to the discrimination operation in Step S13 described above.

If it is discriminated in Step S15 that insufficient buffering is not caused, it is assumed that some of the machining programs are normally accumulated in the transfer buffer and that the machining can be safely resumed as it is because the machining by the machining programs that include the non-machining path L2 on which the tool can be kept on standby is carried out. And then, the machining controller 120 executes the normal machining subroutine SP to finish the machining command operation. In contrast, if it is discriminated in Step S15 that the insufficient buffering is caused (or there is a possibility of insufficient buffering occurring during the machining), the machining controller 120 executes the standby subroutine SS so that the tool is reliably kept on standby (machining stoppage) on the non-machining path L2 included in some of the read machining programs to finish the machining command operation.

FIG. 5 is a flowchart showing an outline of an operation of the normal machining subroutine SP shown in FIG. 4. As shown in the flowchart of FIG. 4 for the machining command operation, the normal machining subroutine shown in FIG. 5 is an operation that is performed without regard to whether or not the machining is currently being performed. The normal machining subroutine SP is an operation performed based on the premise that it is discriminated by the buffer state discriminator 140 that insufficient buffering is not caused, as a result of the machining simulation performed by the simulation executor 130 using the read machining programs.

More specifically, as shown in FIG. 5, the machining controller 120 issues a machining command for the machine tool 10 based on the data of some of the read machining programs (Step SP1). Subsequently, the machining controller 120 issues an erasure command for erasure from the transfer buffer to the machine tool 10, for the commanded machining programs having already undergone the machining (Step SP2) to finish the subroutine.

In the case illustrated in the flowchart of FIG. 5, the machining controller 120 issues the erasure command of Step SP2 as it is after the machining command of Step SP1. However, the machining controller 120 may alternatively be configured so that an operation for discriminating whether or not the unit block machining shown as Step S6 in FIG. 3 is finished is added between, for example, Steps SP1 and SP2 and that the machining controller 120 issues the erasure command only when the unit block machining command is finished. In this way, the machining command and the erasure command are performed for each machining block, so that the load on the machining controller 120 caused by data erasure can be reduced.

Figure 6:
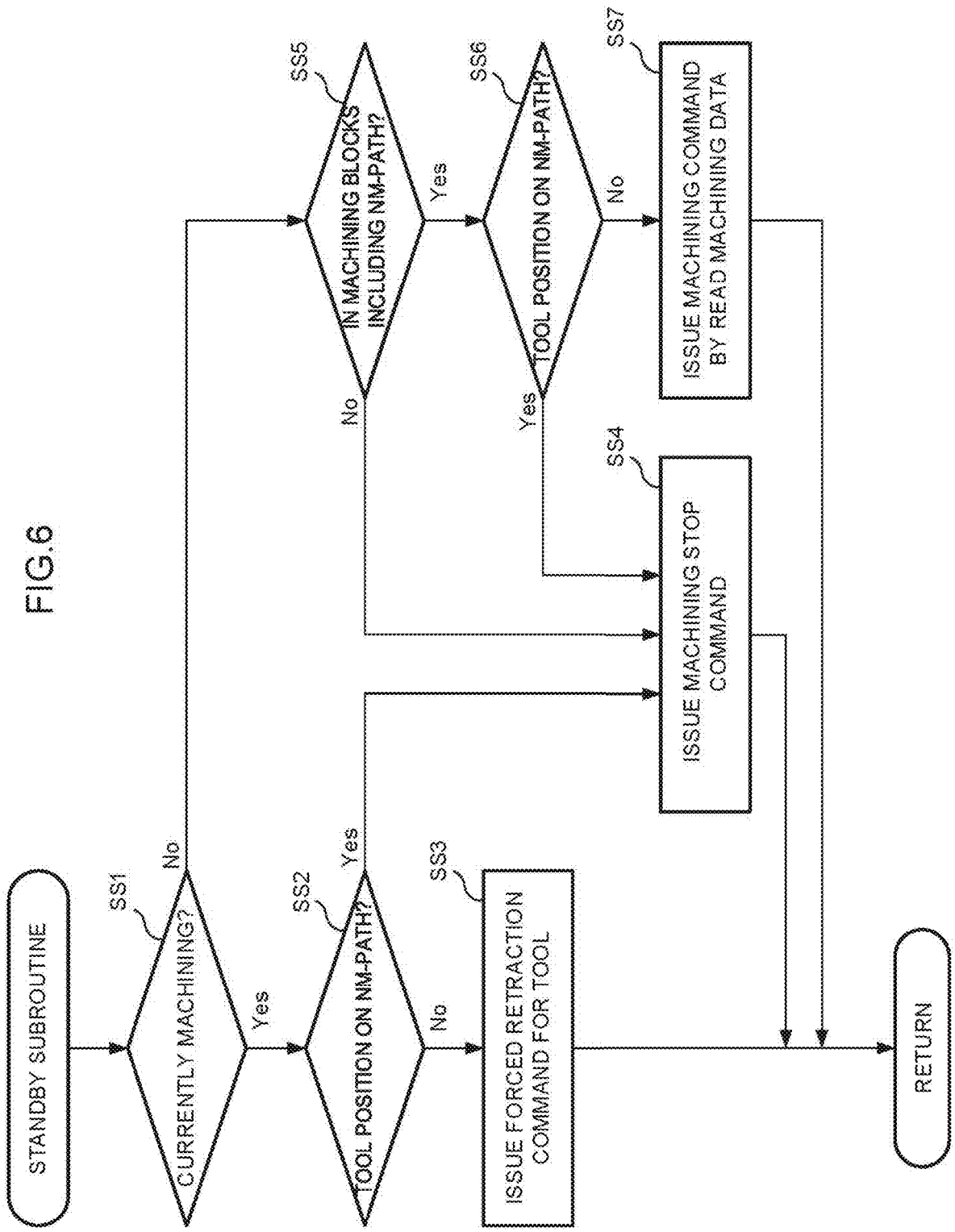
FIG. 6 is a flowchart showing an outline of an operation of a standby subroutine shown in FIG. 4.

FIG. 6 is a flowchart showing an outline of an operation of the standby subroutine SS shown in FIG. 4. As shown in the flowchart of FIG. 4 for the machining command operation, the standby subroutine shown in FIG. 6 is an operation that is performed without regard to whether or not the machining is currently being performed. The standby subroutine is an operation performed if it is discriminated by the buffer state discriminator 140 that insufficient buffering is caused or if there are no machining blocks including the non-machining path L2 in the machining programs read while the machining is stopped, as a result of the machining simulation performed by the simulation executor 130 using the read machining programs.

More specifically, as shown in FIG. 6, the machining control device 100, or the machining controller 120 in particular, first discriminates whether or not the machine tool 10 is currently performing the machining operation (Step SS1). If it is discriminated in Step SS1 that the machining operation is currently being performed, it is further discriminated whether or not the current machining position (tool position) is on the non-machining path (NM-path) L2 (Step SS2). At this time, the operation for identifying the current tool position can be performed by a manner in which coordinate values in tool position control are compared with coordinate values on individual machining paths obtained by the machining simulation described above, for example, or a manner in which contact between the tool and the workpiece is detected based on a sensor value of a load sensor (not shown), such as a torque sensor, attached to a tool retaining mechanism in the machine tool 10 and configured to measure a load on the tool.

Operations performed in Steps SS1 and SS2 correspond to a case in which the standby subroutine SS is reached via Steps S12 and S13 in the flowchart of FIG. 4, for example. In this case, insufficient buffering is caused during the machining (or there is a possibility of insufficient buffering occurring during the machining), so that the machining may possibly be inevitably stopped on the machining path L1. Thereupon, if it is discriminated in Step SS2 that the current tool position is not on the non-machining path L2 (or, is on the machining path L1), the machining controller 120 immediately issues a forced retraction command for the tool (Step SS3) to finish the subroutine. In this way, the machining can be restrained from being unintentionally stopped to make a flaw, such as a cutter mark, on the workpiece due to insufficient buffering.

In contrast, if it is discriminated in Step SS2 that the current tool position is on the non-machining path L2, the machining controller 120 can determine that the tool and the workpiece are not in contact each other, so that the controller 120 issues a command for stopping the machining in the position concerned (Step SS4) to finish the subroutine. In this way, the machining can be safely stopped despite the occurrence of insufficient buffering.

Moreover, if it is discriminated in Step SS1 that the machining operation is not currently being performed, the machining controller 120 further discriminates whether or not the current tool position is in the machining blocks including the non-machining path (NM-path) L2 (Step SS5). This discrimination operation can be performed by, for example, discriminating whether or not the coordinate values in the tool position control are within the range of each machining block obtained by the machining simulation described above.

If it is discriminated in Step SS5 that the current tool position is not in the machining blocks including the non-machining path L2, the machining controller 120 issues a machining stop command, determining that the tool is stopped in a safe position (Step SS4), and finishes the subroutine with maintaining the machining stop state. This operation corresponds to a case in which the standby subroutine SS is reached via Steps S12 and S14 in the flowchart of FIG. 4, for example.

In contrast, if it is discriminated in Step SS5 that the current tool position is in the machining blocks including the non-machining path L2, the machining controller 120 further discriminates whether or not the current tool position is on the non-machining path (NM-path) L2 (Step SS6). This discrimination operation is similar to that in the case of Step S13 described above.

If it is discriminated in Step SS6 that the current tool position is on the non-machining path L2, it can be determined that the tool and the workpiece are not in contact with each other, so that a command for stopping the machining in the position concerned is issued (Step SS4) and the subroutine is then finished. In contrast, if it is discriminated that the current tool position is not on the non-machining path L2, then the non-machining path L2 exists in the same block. Therefore, the machining controller 120 issues a machining continuation command based on the read machining program data to advance the machining to the non-machining path L2 (Step SS7) and then finishes the subroutine.

FIG. 7 is a timing chart showing an example of the machining control method for a machine tool according to the first embodiment. FIG. 7 has its abscissa representative of the elapsed time and shows reading times for machining programs for executing machining for the machining blocks N1 to N8 and actual machining times. FIG. 2B shows the machining execution times for the individual machining blocks. In the Figure, those machining blocks which include the non-machining path L2 are underlined. Moreover, the machining program reading time (transfer time) for each machining block is assumed to be fixed at 1 second.

As shown in FIG. 7, based on the flowchart of FIG. 3 for the machining program reading operation, the total reading time for the machining program acquisitor 110 to read all the machining programs including the machining blocks N1 to N8 from the external storage 20 is 8 seconds. On the other hand, if the machine tool 10 attempts to continuously perform the machining for the machining blocks N1 to N8 under the control by the machining control device 100, based on the flowcharts of FIGS. 4 to 6 for the machining control operation, the integrated total machining time is 4.3 seconds.

When the machining control operation according to the present invention is started, the machining program acquisitor 110 first starts to read machining program data of the machining block N1 from the external storage 20. As this time, according to the machining simulation performed by the simulation executor 130, the machining times (execution times) for the machining blocks N1 and N2 are 1.0 second and 0.1 second, respectively. The total reading time for the machining blocks N1 and N2 is 2.0 seconds. Therefore, in Step S13 in the flowchart of FIG. 4, the buffer state discriminator 140 discriminates that insufficient buffering is caused, and on receiving the result of this discrimination, the machining controller 120 transfers the stage of the operation to the standby subroutine SS shown in FIG. 6.

In the standby subroutine SS, an operation is performed along a path in which Step SS4 is reached via Steps SS1 and SS5. In this way, if it is discriminated that insufficient buffering of accumulated data of the transfer buffer is caused as a result of the machining simulation, the machining controller 120 performs control to stop the machining on a non-machining path short of the position of occurrence of the insufficient buffering. Consequently, the machining block N2 is on the non-machining path L2, so that actual machining of the machining block N1 is performed during 1.0 to 2.0 seconds immediately after the machining programs for the machining block N1 are read to stop the tool in the machining block N2.

Subsequently, when the processing transfers to machining control operations for the machining block N3 and its subsequent blocks, substantially the entire structure of the machining blocks N3 to N5 is composed of the machining path L1, as shown in FIG. 2A. Therefore, if insufficient buffering is caused in an intermediate position when an attempt is made to continuously machine these machining blocks, the machining operation will inevitably stop on the machining path L1.

Thereupon, the machining controller 120 performs control for standby until the machining program acquisitor 110 is enabled to accumulate the machining programs for N3 to N5 while the tool is in the machining block N2, as shown in FIG. 7. In this embodiment, while the machining programs for the machining block N5 finish being read in 5.0 seconds afterwards, the machining blocks N2 to N4 require a machining time of 1.1 seconds. Therefore, the tool is kept on standby in the machining block N2 for 1.9 seconds until it is discriminated in Step S15 in the flowchart of FIG. 4 that insufficient buffering will not occur (or until it is determined that insufficient buffering will not occur even after the execution of the machining block N5), for example.

In the mode of standby in the machining block N2 described above, data up to the middle of the machining block N4 (up to 3.9 seconds) are read by the machining program acquisitor 110. Therefore, even in case the machining from the machining block N2 is resumed in 3.9 seconds afterwards, machining program data up to the machining block N5 finish being read during the machining concerned. Consequently, the machining for the machining blocks N2 to N5 is performed in 2.9 to 5.8 seconds. At this time, the tool is kept on standby in the machining block N6.

Likewise, while the machining time for the machining block N6 is 0.1 second, the machining end time point up to the machining block N5 is reached is 5.8 seconds afterwards. Therefore, insufficient buffering is inevitably caused if the machining is simultaneously advanced while the machining program acquisitor 110 is reading the machining programs for the machining block N6. Accordingly, the machining controller 120 keeps the tool on standby in the machining block N6 least insufficient buffering be caused during the execution of the machining for the machining blocks N6 to N8.

More specifically, because the integrated machining time for the machining blocks N6 and N7 is 1.1 seconds, the tool is kept on standby in the machining block N6 for 1.1 seconds, for example, so that the machining for the machining block N7 ends just in 8.0 seconds after the machining programs up to the machining block N8 finishes being read. In this way, reading the machining programs for the machining block N8 is finished by the time when the machining for the machining block N7 is finished, so that the machining operation (tool movement) for the machining block N8 can be immediately performed in 8.0 seconds afterwards. Consequently, the machining control operation can be completed in 8.3 seconds, the shortest time from the end of reading of the machining block N8 to the machining.

As described above, according to the machining control device and method for a machine tool according to the first embodiment of the present invention, the state of insufficient buffering can be overcome without providing any special additional points in machining programs and without reducing the yield of production after machining, in automatic machining control of the machine tool. This can be done because the buffer state of the machining programs is discriminated, based on the result of the machining simulation using the sequentially read machining program data, and the machining is stopped on the non-machining path short of the position of occurrence of the insufficient buffering in accordance with the result of this discrimination.

Second Embodiment

Figures 8A, 8B:
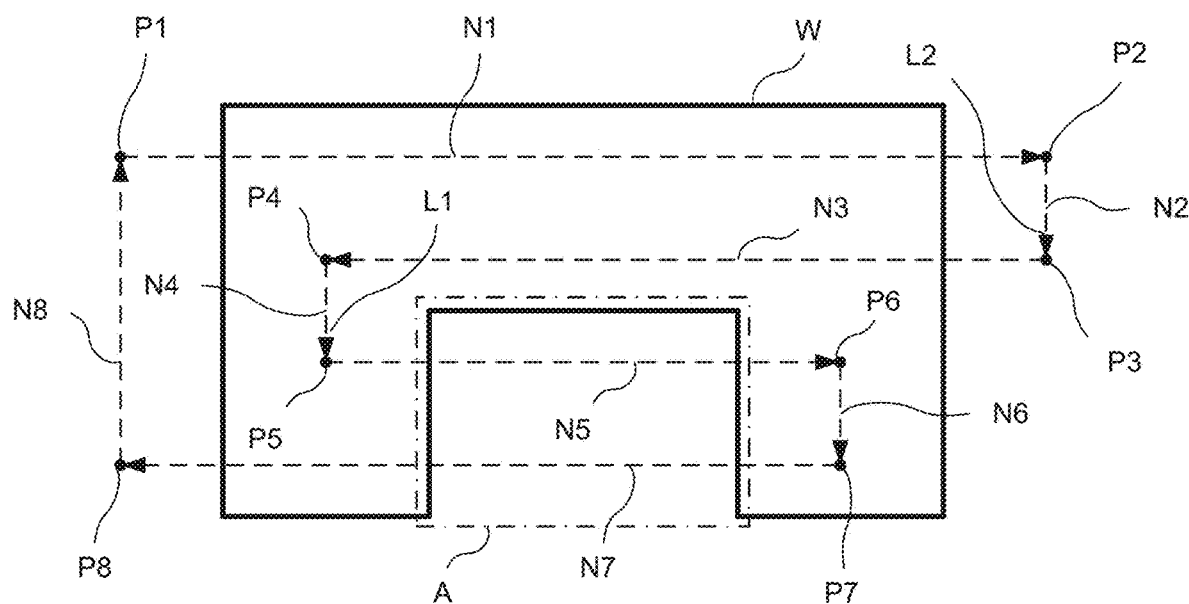
FIGS. 8A and 8B are plan views showing the relationship between a workpiece and a machining path according to a second embodiment of the machining control device and its peripheral devices shown in FIG. 1.

FIG. 8A is a plan view showing the relationship between a workpiece and a machining path according to a second embodiment, in the representative exemplary machining control method for a machine tool of the present invention. As shown in FIG. 8A, in the second embodiment as in the case of the first embodiment, a workpiece W with a substantially C-shaped cross section is subjected to machining control by a machining program composed of machining blocks N1 to N8 that connect indication points P1 to P8. Moreover, each of the machining blocks N1 to N8 includes a machining path L1 along which the workpiece W is machined by a tool (not shown) and a non-machining path L2 along which the tool moves at a distance from the workpiece W. Furthermore, FIG. 8B shows execution times (seconds) for the individual machining blocks N1 to N8 during the machining of the workpiece W shown in FIG. 8A.

In the second embodiment, configurations shared with the first embodiment can be adopted for the block diagram of FIG. 1 showing the relationship between the machining control device and its peripheral devices, the flowcharts of FIGS. 3 to 5 showing the machining program reading operation and machining control operation, and the flowchart showing the normal machining subroutine, so that repeated representations thereof will be omitted hereinafter. Also in the description of the second embodiment, same reference numerals are used to refer to the similar or common configurations described in connection with the first embodiment, and repeated representations thereof will be omitted.

In the case described for the first embodiment shown in FIG. 2A, the machining programs are composed of machining blocks, such as the machining blocks N1, N3, N5 and N7, including the non-machining path L2 at one or both ends of machining block. On the other hand, in the case to be described for the second embodiment, as shown in FIG. 8A, machining programs are composed of machining blocks, such as a machining blocks N5 and N7, including a non-machining path L2 in the middle of a machining path L1. Thus, in the machining control method according to the second embodiment, machining is performed for a workpiece such that a non-machining area A is included in the middle of the machining block.

Figure 9:
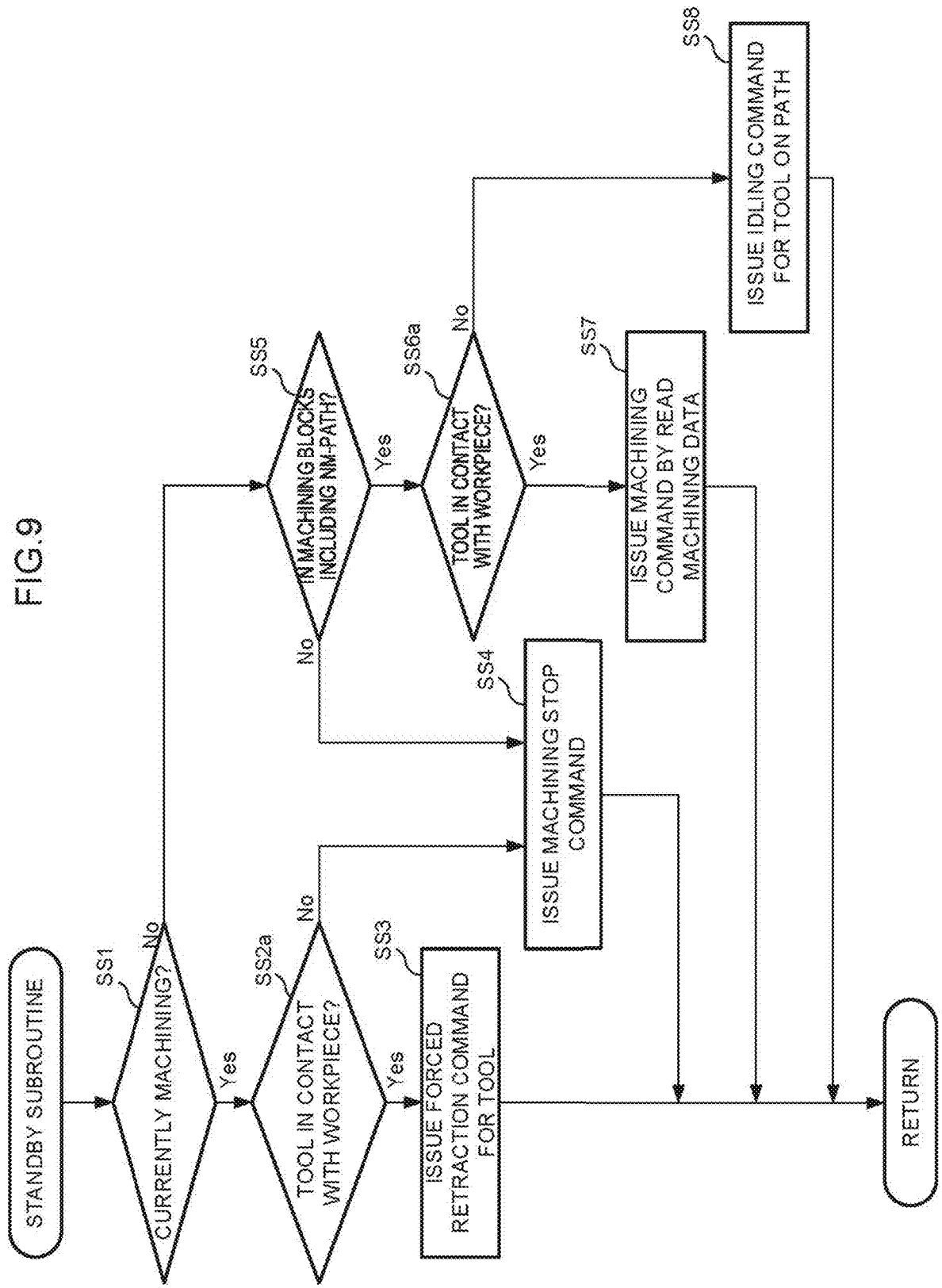
FIG. 9 is a flowchart showing an outline of an operation of a standby subroutine according to the second embodiment.

FIG. 9 is a flowchart showing an outline of an operation of a standby subroutine according to the second embodiment. The standby subroutine shown in FIG. 9, as in the case of the first embodiment, is an operation that is performed without regard to whether or not the machining is currently being performed. The standby subroutine shown in FIG. 9 is an operation performed if it is discriminated by a buffer state discriminator 140 that insufficient buffering is caused or if there are no machining blocks including the non-machining path L2 in the machining programs read while the machining is stopped, as a result of a machining simulation performed by a simulation executor 130 using the read machining programs.

More specifically, as shown in FIG. 9, a machining control device 100, or a machining controller 120 in particular, first discriminates whether or not a machine tool 10 is currently performing the machining operation (Step SS1). If it is discriminated in Step SS1 that the machining operation is currently being performed, it is discriminated whether or not the tool in the current machining position (tool position) is in contact with the workpiece (Step SS2a). As this is done, the operation for discriminating whether or not the tool is in contact with the workpiece may be performed by a manner in which contact between the tool and the workpiece is detected based on a sensor value of a load sensor (not shown), such as a torque sensor, attached to a tool retaining mechanism in the machine tool 10 and configured to measure a load on the tool.

As in the case shown in FIG. 6, if it is discriminated in Step SS2a that the tool is in contact with the workpiece, the machining controller 120 immediately issues a forced retraction command for the tool (Step SS3) to finish the subroutine. In this way, the machining can be restrained from being unintentionally stopped to make a flaw, such as a cutter mark, on the workpiece due to insufficient buffering.

In contrast, if it is discriminated in Step SS2a that the tool is not in contact with the workpiece, it can be determined that actual machining is not being carried out although the workpiece is originally expected to be being machined. Therefore, the machining controller 120 issues a command for stopping the machining in the position concerned (Step SS4) to finish the subroutine. In this way, it becomes easier to ascertain the position in which the machining control operation is subjected to trouble.

Moreover, if it is discriminated in Step SS1 that the machining operation is not currently being performed, the machining controller 120 further discriminates whether or not the current tool position is in the machining blocks including the non-machining path (NM-path) L2 (Step SS5). If it is discriminated in Step SS5 that the current tool position is not in the machining blocks including the non-machining path L2, as in the case of the first embodiment, the machining controller 120 issues a machining stop command, determining that the tool is stopped in a safe position (Step SS4), and finishes the subroutine with maintaining the machining stop state.

In contrast, if it is discriminated in Step SS5 that the current tool position is in the machining blocks including the non-machining path L2, the machining controller 120 further discriminates whether or not the tool is in contact with the workpiece (Step SS6a). This discrimination operation is similar to that in the case of Step SS2a. If it is discriminated in Step SS6a that the tool is in contact with the workpiece, it can be determined that the current tool position is on the machining path L1 in the machining blocks including the non-machining path L2. Therefore, the machining controller 120 issues a machining continuation command based on the read machining program data to advance the tool to the non-machining path L2 (Step SS7) to finish the subroutine.

In contrast, if it is discriminated in Step SS6a that the tool is not in contact with the workpiece, the machining controller 120 issues a command for causing the tool to idle (or move without workpiece machining) on the non-machining path L2, using the read machining program data, to advance the tool to the terminal end of the non-machining path L2 (Step SS8) to finish the subroutine. In this way, the machining control operation can be performed with a minimum machining time loss even in case the machining is performed with the machining and non-machining paths L1 and L2 mixed in the same machining block, that is, with the non-machining area A shown in FIG. 8A included in the machining block.

FIG. 10 is a timing chart showing an example of the machining control method for a machine tool according to the second embodiment. As in the case of the first embodiment, FIG. 10 also has its abscissa representative of the elapsed time and shows reading times for machining programs for executing machining for the machining blocks N1 to N8 and actual machining times. FIG. 8B shows the machining execution times for the individual machining blocks. In the Figure, those machining blocks which include the non-machining path L2 are underlined. Moreover, the machining program reading time (transfer time) for each machining block is assumed to be fixed at 1 second.

As shown in FIG. 10, based on the flowchart of FIG. 3 for the machining program reading operation, 8 seconds are required for the total reading time by the acquisitor 10 to read all the programs including the machining blocks from the storage. On the other hand, if the machine tool 10 attempts to continuously perform the machining for the machining blocks N1 to N8, based on the flowcharts of FIGS. 4, 5 and 9 for the machining control operation, the integrated total machining time is 4.0 seconds.

When the machining control operation according to the present invention is started, the machining program acquisitor 110 first starts to read machining program data of the machining block N1 from the external storage 20. In this embodiment, based on the machining simulation performed by the simulation executor 130, the machining times (execution times) for the machining blocks N1 and N2 are 1.0 second and 0.1 second, respectively. The total reading time for the machining blocks N1 and N2 is 2.0 seconds. Therefore, it is discriminated in Step S13 in the flowchart of FIG. 4 that insufficient buffering is caused. On receiving the result of this discrimination, the machining controller 120 transfers the stage of the operation to a standby subroutine SS shown in FIG. 9.

In the standby subroutine SS, an operation is performed along a path in which Step SS4 is reached from Steps SS1 via SS5. In this way, if it is discriminated that insufficient buffering of accumulated data of the transfer buffer is caused as a result of the machining simulation, as in the case of the first embodiment, the machining controller 120 performs control to stop the machining on a non-machining path short of the position of occurrence of the insufficient buffering.

Consequently, actual machining of the machining block N1 is performed during 1.0 to 2.0 seconds immediately after the machining programs for the machining block N1 are read. As this is done, the machining block N2 also finishes being read during the machining for the machining block N1, so that the tool is moved corresponding to the machining block N2 during 2.0 to 2.1 seconds. Thereupon, the tool stops at the terminal end of the machining block N2.

Subsequently, when the processing transfers to machining control operations for the machining block N3 and its subsequent blocks, substantially the entire structure of the machining blocks N3 to N4 is composed of the machining path L1, as shown in FIG. 8A and the non-machining path L2 is included in the machining block N5. Therefore, if insufficient buffering is caused during the machining for the machining blocks N3 and N4 when an attempt is made to continuously machine these machining blocks, the tool will inevitably stop the machining on the machining path L1.

Thereupon, control is performed for standby until the machining program acquisitor 110 is enabled to accumulate the machining programs for N3 to N5 while the tool is in the machining block N2, as shown in FIG. 10. More specifically, while the machining programs for the machining block N5 finish being read in 5.0 seconds afterwards, the machining blocks N3 and N4 require a machining time of 1.0 second. Therefore, the tool is kept on standby at the terminal end of the machining block N2 for 1.9 seconds until it is discriminated in Step S15 in the flowchart of FIG. 4 that insufficient buffering will not occur (or until it is determined that insufficient buffering will not occur even after the execution of the machining block N5), for example.

In the mode of standby at the terminal end of the machining block N2 described above, the machining program acquisitor 110 can be supposed to have read data up to the terminal end of the machining block N4 (up to 4.0 seconds). Therefore, even in case the machining from the machining block N3 is resumed in 4.0 seconds afterwards, machining program data up to the machining block N5 finish being read during the machining concerned. Consequently, the machining for the machining blocks N3 to N5 is performed in 4.0 to 5.0 seconds.

Subsequently, machining for the machining block N5 is started. At this time, it is understood that the non-machining path L2 is included in the middle of the machining block N5. Therefore, the tool can be kept on standby on the non-machining path L2 even if insufficient buffering is caused in the middle of the machining as a result of the machining simulation. Thereupon, the machining for the machining block N5 can be continued in 5.0 seconds after the machining for the machining block N4 is finished.

In contrast, the machining programs of the machining blocks N6 to N8 are simultaneously read in parallel. In the present embodiment, while the machining time for the machining block N6 is 0.2 second, the end time point of machining, if any, to the terminal end of the machining block N5 is 5.6 seconds afterwards. Therefore, insufficient buffering is inevitably caused in the machining block N6 as a non-machining path if the machining for the machining block N5 is finished while the machining programs for the machining block N6 are being read. Accordingly, the tool is kept on standby on the non-machining path L2 in the machining block N5 least insufficient buffering be caused during the execution of the machining for the machining blocks N6 to N8.

More specifically, while machining is performed based on a normal machining subroutine SP shown in the flowchart of FIG. 4 for the machining control operation until the middle of machining block N5, it is expected that insufficient buffering will occur thereafter and the processing transfers to the standby subroutine SS. In the standby subroutine SS shown in FIG. 9, the operation is changed transferred from Step SS1 to Step SS5, whereupon the tool is moved to the terminal end of the non-machining path L2 in the machining block N5 and kept on standby. As this operation is done, it is discriminated in the standby subroutine SS whether or not the tool and the workpiece are in contact with each other, so that the tool can be reliably kept on standby on the non-machining path L2 free from contact between the tool and the workpiece.

Because the integrated machining time for the machining blocks N6 and N7 is 1.0 second, the machining controller 120 keeps the tool on the non-machining path L2 in the machining block N5 for 1.4 seconds, for example, so that the machining for the machining block N7 ends just in 8.0 seconds, which is equivalent to time until the machining programs up to the machining block N8 finishes being read. When it is determined that the insufficient buffering is cancelled, the machining controller 120 resumes the machining starting from the remainder of the machining block N5. In this way, reading the machining programs for the machining block N8 is finished by the time when the machining for the machining block N7 is finished, so that the machining operation (tool movement) for the machining block N8 can be immediately performed in 8.0 seconds afterwards. Consequently, the machining control operation can be completed in 8.3 seconds, the shortest time from the end of reading of the machining block N8 to the machining.

As described above, according to the machining control device and method for a machine tool according to the second embodiment of the present invention, a cutter mark or the like can be restrained from being made on the workpiece and the state of insufficient buffering can be overcome without reducing the yield of production after machining. This can be done because the machining control device and method for a machine tool according to the second embodiment can detect whether or not the tool and the workpiece are in contact with each other and locate the tool standby position on the non-machining path free from contact between the tool and the workpiece.

The present invention is not limited to the above-described embodiments and may be suitably changed without departing from the spirit of the invention. The present invention is configured so that any constituent elements of the embodiments can be modified or omitted within the scope of the invention.

The invention claimed is:

1. A machining control device for a machine tool configured to perform machining control for a workpiece using a machining program including a machining path and a non-machining path, comprising:
   a machining program acquisitor configured to read the machining program for each predetermined reading unit;
   a machining controller configured to control a machining operation of the machine tool based on the machining program read by the machining program acquisitor;
   a simulation executor configured to perform a machining simulation by sequentially reading out the machining program read by the machining program acquisitor; and
   a buffer state discriminator configured to discriminate a buffer state of the machining program acquisitor, based on the result of the machining simulation,
   the machining controller being configured to perform control to stop machining on the non-machining path short of the position of occurrence of insufficient buffering if the insufficient buffering is discriminated by the buffer state discriminator.

2. The machining control device according to claim 1, wherein the machining controller continues control to stop the machining until it is discriminated that the state of insufficient buffering is cancelled after the insufficient buffering is once discriminated by the buffer state discriminator.

3. The machining control device according to claim 2, wherein the machining controller further performs control to move the position of a tool to the trailing end of the non-machining path while the insufficient buffering continues to be discriminated by the buffer state discriminator.

4. The machining control device according to claim 1, wherein the machining controller performs control to resume the machining if it is discriminated by the buffer state discriminator that the machining program for the range from the current non-machining path on which the machining is stopped, via a machining path next thereto, to a further next non-machining path is accumulated by the machining program acquisitor.

5. A machining control method for a machine tool configured to perform machining control for a workpiece using a machining program including a machining path and a non-machining path, comprising:
    reading the machining program for each predetermined reading unit,
    in controlling a machining operation of the machine tool based on the read machining program, the method further comprising:
    performing a machining simulation by sequentially reading out the read machining program and discriminating a buffer state of the machining program based on the result of the machining simulation; and
    stopping machining on the non-machining path short of the position of occurrence of insufficient buffering if the insufficient buffering is discriminated.

6. The machining control method according to claim 5, wherein the machining is stopped until it is discriminated that the state of insufficient buffering is cancelled after the insufficient buffering is once discriminated.

7. The machining control method according to claim 6, wherein the position of a tool is moved to the trailing end of the non-machining path while the insufficient buffering continues to be discriminated.

8. The machining control method according to claim 5, wherein the machining is resumed if it is discriminated that the machining program for the range from the current non-machining path on which the machining is stopped, via a machining path next thereto, to a further next non-machining path is accumulated.

9. A machining control device according to claim 1, wherein
    the simulation executor is configured either to sequentially perform the machining simulation in parallel with a machining program reading operation by the machining program acquisitor, or to execute the machining simulation every time a machining block of the machining program is read by the machining program acquisitor.

10. A machining control device according to claim 1, wherein
    the buffer state discriminator is further configured to
        based on a result of the machining simulation by the simulation executor, perform a comparison of a capacity of machining programs having been consumed by a programmed operation at a point in time with that of machining programs accumulated by buffering, and
        based on a result of the comparison, discriminate whether or not a state in which the capacity of the accumulated machining program is insufficient will occur.

11. A machining control device according to claim 1, wherein
    the buffer state discriminator is further configured to identify the position of occurrence of insufficient buffering, based on:
        a total reading time by the machining program acquisitor to read integrated since a start of the reading under the control of the machining controller, and
        a result of the machining simulation.

\* \* \* \* \*